US010808865B2

(12) United States Patent
Nagai et al.

(10) Patent No.: US 10,808,865 B2
(45) Date of Patent: Oct. 20, 2020

(54) CONTROLLING METHOD OF DRIVING A VACUUM VALVE

(71) Applicant: V-Tex Corporation, Shinagawa-ku, Tokyo (JP)

(72) Inventors: Hideaki Nagai, Hitachinaka (JP); Tomohiro Sawahata, Hitachinaka (JP)

(73) Assignee: V-Tex Corporation, Tokyo (JP)

( * ) Notice: Subject to any disclaimer, the term of this patent is extended or adjusted under 35 U.S.C. 154(b) by 49 days.

(21) Appl. No.: 16/281,732

(22) Filed: Feb. 21, 2019

(65) Prior Publication Data

US 2019/0331257 A1    Oct. 31, 2019

(30) Foreign Application Priority Data

Apr. 27, 2018    (JP) .................... 2018-086023

(51) Int. Cl.
| F16K 51/02 | (2006.01) |
| F16K 3/02 | (2006.01) |
| F16K 37/00 | (2006.01) |
| F16K 3/18 | (2006.01) |

(52) U.S. Cl.
CPC ............ *F16K 51/02* (2013.01); *F16K 3/0254* (2013.01); *F16K 3/18* (2013.01); *F16K 37/0041* (2013.01)

(58) Field of Classification Search
CPC .......... F16K 51/02; F16K 3/18; F16K 3/0254; F16K 37/0083; F16K 37/0041
See application file for complete search history.

(56) References Cited

U.S. PATENT DOCUMENTS

| 5,381,996 | A | * | 1/1995 | Arnemann | .............. | F16K 31/12 |
| | | | | | | 137/554 |
| 5,594,175 | A | * | 1/1997 | Lyon | ....................... | F16K 31/04 |
| | | | | | | 73/593 |
| 5,616,829 | A | * | 4/1997 | Balaschak | ............. | F16K 31/046 |
| | | | | | | 137/551 |
| 8,991,268 | B2 | * | 3/2015 | Crespo Vidal | ...... | F16K 37/0083 |
| | | | | | | 73/862 |
| 9,086,165 | B2 | * | 7/2015 | Nagai | ..................... | F16K 25/00 |
| 9,423,050 | B2 | * | 8/2016 | Anderson | ........... | F16K 31/1262 |
| 9,528,629 | B2 | * | 12/2016 | Anderson | .......... | G05B 23/0235 |
| 9,726,643 | B2 | * | 8/2017 | Comeaux | ............... | G01N 29/14 |

(Continued)

FOREIGN PATENT DOCUMENTS

| JP | 8-304555 A | 11/1996 |
| JP | 11182699 A | * 7/1999 |

(Continued)

OTHER PUBLICATIONS

Japanese-language Search Report dated Dec. 12, 2017 (two (2) pages), with partial English-language translation.

(Continued)

*Primary Examiner* — David Colon-Morales
(74) *Attorney, Agent, or Firm* — Crowell & Moring LLP (57) ABSTRACT

A method of controlling a vacuum valve includes instructing an actuator to reduce an operating speed so that an amplitude falls within the first threshold value when the amplitude obtained from a vibration sensor exceeds a first threshold value and a second threshold value. The method also includes instructing the actuator to return to the operating speed when the amplitude obtained from the vibration sensor is below the second threshold value.

4 Claims, 5 Drawing Sheets

(56) References Cited

U.S. PATENT DOCUMENTS

| | | | |
|---|---|---|---|
| 10,626,749 B2* | 4/2020 | Reigl | F01D 21/20 |
| 2002/0088959 A1* | 7/2002 | Duelli | F16K 3/18 |
| | | | 251/158 |
| 2005/0126639 A1* | 6/2005 | Ens | F16K 37/0083 |
| | | | 137/554 |
| 2006/0033065 A1 | 2/2006 | Duelli et al. | |
| 2010/0108151 A1 | 5/2010 | Duelli et al. | |
| 2010/0116349 A1 | 5/2010 | Fischer | |
| 2013/0306896 A1 | 11/2013 | Nagai et al. | |
| 2014/0110619 A1* | 4/2014 | Borichevsky | F16K 3/0218 |
| | | | 251/326 |
| 2018/0051813 A1* | 2/2018 | Albrecht | F16K 3/18 |
| 2018/0275691 A1* | 9/2018 | Lattanzio | G05B 19/042 |

FOREIGN PATENT DOCUMENTS

| | | |
|---|---|---|
| JP | 2003-232705 A | 8/2003 |
| JP | 3433207 B2 | 8/2003 |
| JP | 2006-52846 A | 2/2006 |
| JP | 4092028 B2 | 5/2008 |
| JP | 5044725 B1 | 10/2012 |
| JP | 5340283 B2 | 11/2013 |
| JP | 5340284 B2 | 11/2013 |
| JP | 2015068468 A * | 4/2015 |
| JP | 2015-133209 A | 7/2015 |

OTHER PUBLICATIONS

Japanese-language Search Report dated Oct. 18, 2017 (two (2) pages), with partial English-language translation.

* cited by examiner

CONTROLLING METHOD OF DRIVING A VACUUM VALVE

TECHNICAL FIELD

The present invention relates to a controlling method of driving a vacuum valve. The invented method elongates service life of the vacuum valve by suppressing vibration that occurs at the time of driving the vacuum valve.

BACKGROUND ART

In a semiconductor manufacturing apparatus, plural chambers are provided and a substrate is conveyed to respective processing chamber. Between chambers is separated with a vacuum valve such as a gate valve, and the gate valve is opened or closed when the substrate is to be conveyed. Further, a vacuum pump is installed on the chamber via a vacuum valve and that vacuum valve is opened when inside the chamber is to be depressurized to bring to vacuum.

For example, when the vacuum valve is closed, opening the valve is apt to incur vibration as a reaction to the opening movement, because the valve body is in close contact with the opening of the chamber. If the vibration occurs due to opening or closing the vacuum valve, particles (foreign matters) are generated in the chamber. Such particles or matters may contaminate a substrate. Incidentally, when the opening and closing speed of the vacuum valve is increased, the vibration tends to become large, further, the vibration also tends to become large even if parts or similar elements deteriorates.

As described in Patent Literature 1, an invention is also disclosed. The disclosed invention is such that the contact point between a sealing material and a sealing surface is detected by current of a valve driving motor, and the driving speed and the driving position are controlled based on the detected contact position. However, the vibration associated with the valve opening and closing operation propagates to a process chamber, causing foreign matter adhered to the inner wall of the chamber and foreign matter stuck to a valve body to come off contaminating the inside of the chamber. In addition, vibration cannot be measured when such vibration is caused by a valve operation within an allowable range. For this reason, it is necessary to suppress the valve driving speed and acceleration more than needed to operate the valve at a lower speed in order to suppress the coming-off of foreign matter and to reduce contamination by foreign matter. This leads to a decrease in productivity.

In addition, as described in Patent Literature 2, an invention is disclosed in which the driving of valve is controlled to suppress occurrence of vibration by detecting the occurrence of vibration on the valve driving. However, a method for suppressing vibration is not specifically described. Moreover, in order to suppress vibration, the operation speed of the valve is lowered more than needed in return for suppressing vibration.

In addition, Patent Literature 3 discloses an invention for diagnosing the service life. In the invention, the variation of the acceleration of a rotating machine over time is acquired, which is then compared with the threshold value to diagnose the service life. However, in a rotating machine, it is enough to detect only an abnormal vibration different from ordinary vibration, because the rotary machine continues a rotating operation about a rotating shaft.

LITERATURES OF RELATED ART

Patent Literatures

[Patent Literature 1]
 Japanese Patent No. 5340283
[Patent Literature 2]
 Japanese Unexamined Patent Application Publication No. 2015-133209
[Patent Literature 3]
 Japanese Unexamined Patent Application Publication No. 2003-232705

SUMMARY OF INVENTION

Technical Problem

For a vacuum valve, it is important to balance suppressing vibration and maintaining operating speed. An attempt to reduce the vibration or oscillation may make the opening and closing operation time sacrifice. The allowable range of vibration varies depending on the apparatus and installation position of the vacuum valve on the apparatus. The performance will be good if the vacuum valve can be driven with the maximum allowable vibration.

Additionally, the driving parts such as motors are lifetime-limited products, therefore the movement becomes worse and the generated vibration increases if they deteriorate. If the replacement timing of the driving parts can be known by the increase of the amplitude, maintainability of the apparatus is secured.

Therefore, it is an object of the present invention to control the vibration within an allowable range by regulating the operation speed of the vacuum valve.

Solution to Problem

To solve the above-stated problem, the present invention provides a controlling method for driving a vacuum valve in a valve system as mentioned below.

In the controlling method for driving a vacuum valve in a valve system, which comprising:

a valve body that opens and closes an opening of the vacuum valve, an actuator that moves the valve body between a closed position and an open position of the valve body, a vibration sensor for detecting vibration of the valve body, and a computing unit that instructs the actuator about a speed of the valve body, wherein the control method is characterized in that
the computing unit
stores a predefined first threshold value and a second threshold value,
instructs the actuator to reduce an operating speed so that an amplitude falls within the first threshold value when the amplitude obtained from the vibration sensor exceeds the first threshold value and the second threshold value, and
instructs the actuator to return to the operating speed when the amplitude obtained from the vibration sensor is below the second threshold value.

In the vacuum valve driving control method, the computing unit counts a number of times that the amplitude acquired from the vibration sensor exceeds the first threshold value and a number of times when the amplitude falls below the second threshold value, and outputs a request of replacement when such count exceeds a predetermined number of times.

Further, in the vacuum valve driving control method, the computing unit discriminates the type of vibration acquired from the vibration sensor, and excludes an influence of vibration not caused by driving of the valve body.

Furthermore, the vacuum valve of the present invention is controlled by the driving control method.

Advantageous Effects of Invention

According to the present invention, detecting the vibration while the vacuum valve is being driven to regulate the operation speed makes development of the parts deterioration retard, thereby also slows the replacement timing. Thus, the service life of the vacuum valve can be elongated as a result. In the vacuum valve, the substrate contamination by particles can be suppressed by controlling vibration within an allowable range without elongating the opening and closing operation time as much as possible.

MODE OF IMPLEMENTING INVENTION

Hereinafter, embodiments of the present invention will be described in detail referring to drawings. Those having the same function are denoted by the same reference numerals, and repeated explanations thereof may be omitted.

Embodiment 1

Figure 1:
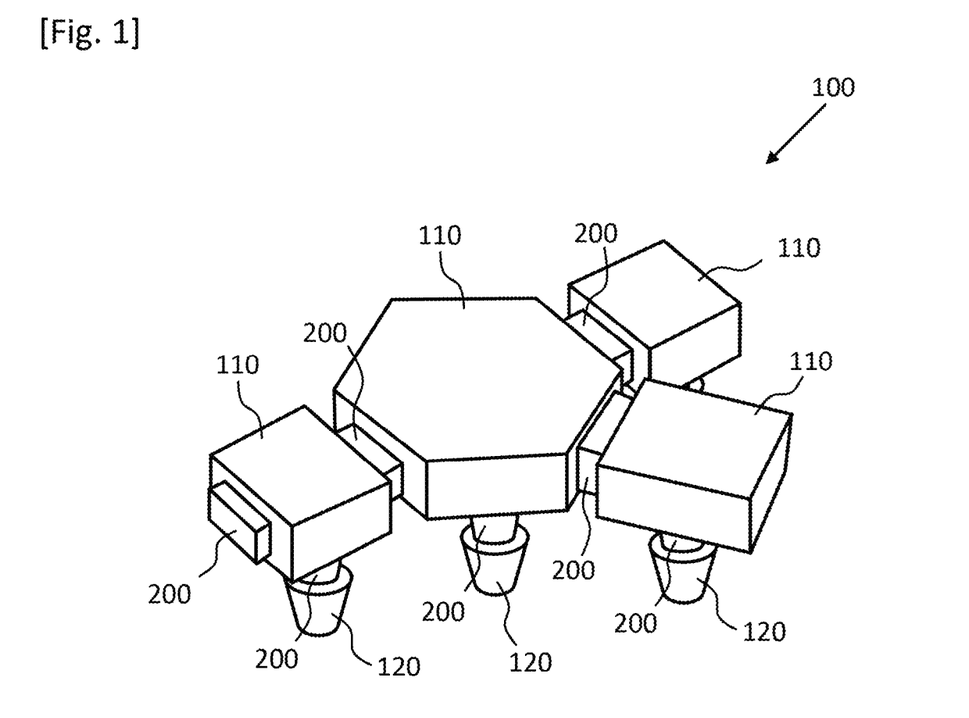
FIG. 1 is a perspective view to show an overview of a semiconductor manufacturing apparatus to which the invented driving control method is applied.
Figure 2:
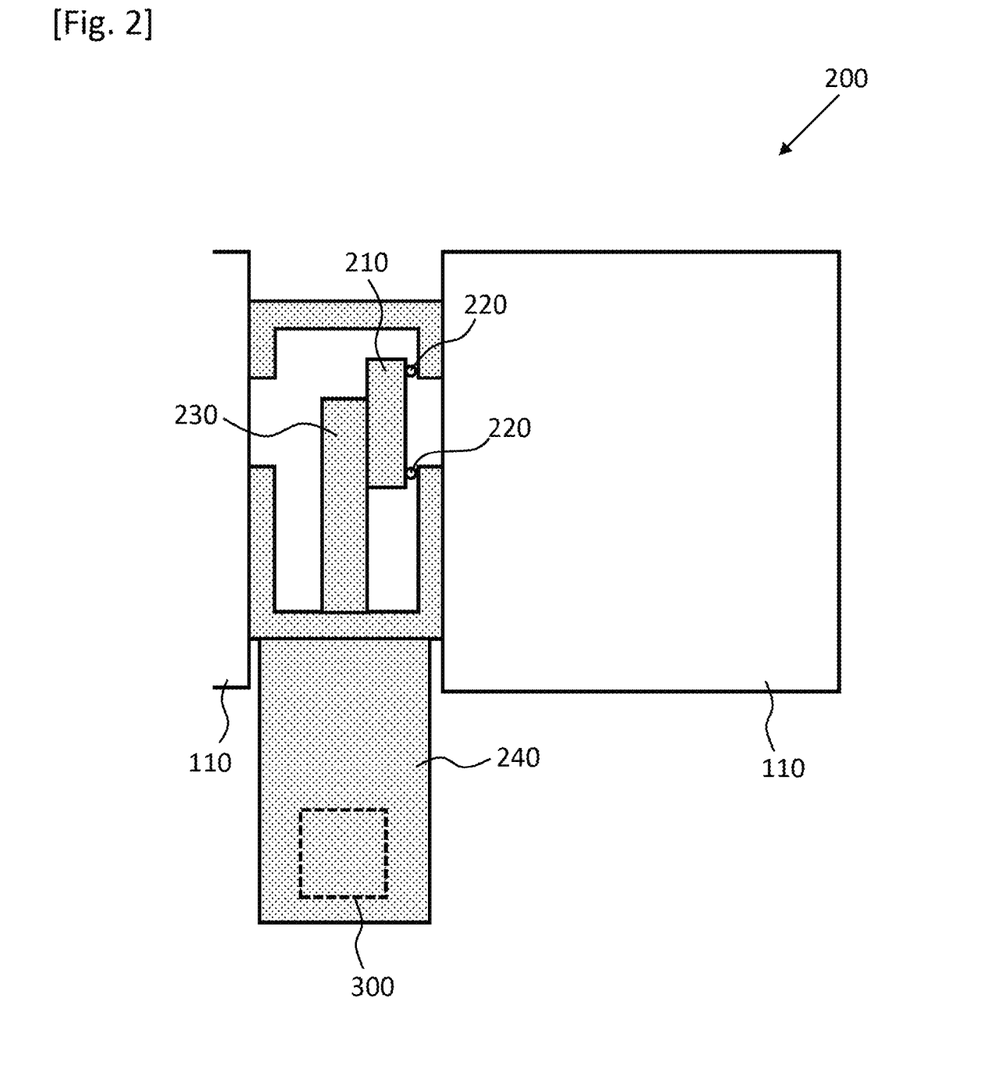
FIG. 2 is a cross-sectional view to show a construction of a vacuum valve to which the invented driving control method is applied.
Figure 3:
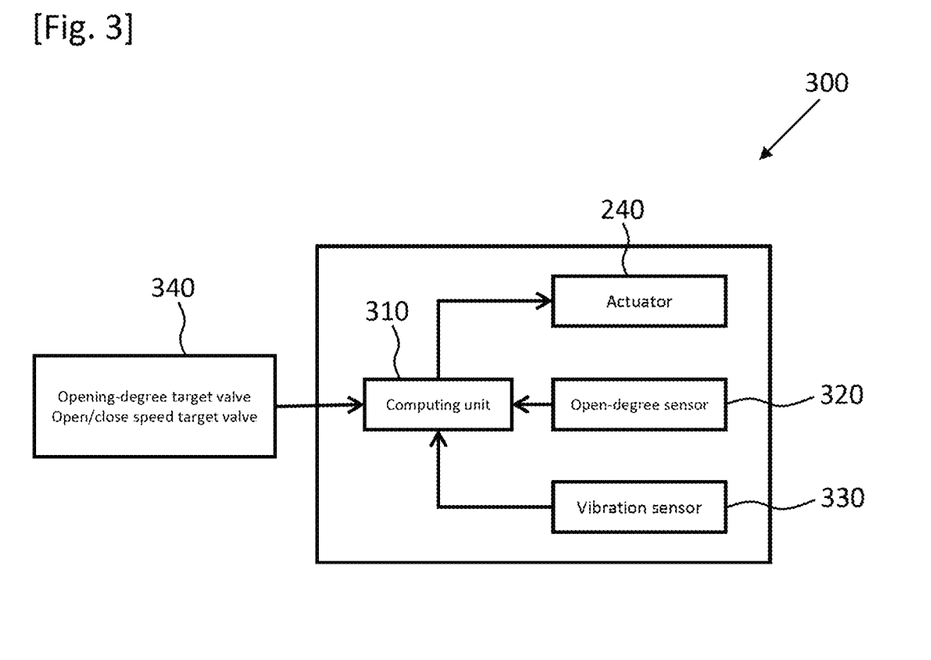
FIG. 3 is a block diagram to show a configuration of a control unit that execute the invented control method for driving a vacuum vale.

First, a semiconductor manufacturing apparatus will be described to which the invented control method of driving a vacuum valve is applied. FIG. 1 is a perspective view to show the overview of a semiconductor manufacturing apparatus. FIG. 2 is a cross-sectional view to show the construction of the vacuum valve to be installed in the semiconductor manufacturing apparatus. FIG. 3 is a block diagram to show the configuration of the vacuum valve control unit.

As shown in FIG. 1, a semiconductor manufacturing apparatus 100 comprises a plurality of chambers 110, and processing is performed by conveying a substrate to each chamber 110 for respective processing. For example, in the case of a cluster type layout wherein a plurality of chambers 110 are arranged in a star formation, chambers such as a load (unload) lock chamber which serves as a preliminary vacuum chamber and a process chamber which serves as a processing chamber are disposed around a transfer chamber which serves as a transit space.

A vacuum valve 200 for closing an opening is installed between each of chambers 110. In addition, a vacuum pump 120 is installed on each of chambers 110 for evacuation via a vacuum valve 200 for exhausting. Each chamber 110 is depressurized to a predetermined value by a vacuum pump 120. Then, the vacuum valve 200 is opened when the substrate is conveyed to the chamber 110, and is closed when the substrate is to be processed in the chamber 110.

As FIG. 2 shows, the vacuum valve 200 is a high-airtightness on-off valve installed on the chamber 110. The vacuum valve 200 is classified, according to its usage, into such as a door valve to be installed at the entrance/exit of the semiconductor manufacturing apparatus 100, a gate valve to be installed between the chambers 110, and an exhaust valve to be installed between the chamber 110 and the vacuum valve 120.

In addition, the vacuum valve 200 is further classified by its shape into such as a square valve, a butterfly valve, and a pendulum valve. The square valve opens and closes by sliding the valve body up and down, a butterfly valve rotates a disk-like valve body around the shaft that penetrates the opening, and the pendulum valve that makes the valve body to behave a pendular motion to close the opening.

The square gate valve, for example, is comprised of a valve body 210 for closing the opening of the chamber 110, a sealing material 220 for maintaining airtightness when the valve body 210 is in closed position, a valve rod 230 for supporting the valve body 210, an actuator 240 for moving the valve rod 230, and a control unit 300 for giving an operation instruction to the actuator 240.

For the valve body 210, a plate material may be used where the plate is slightly larger than the opening of the chamber 110. As the sealing material 220, such as a rubber O-ring can be used and may be disposed along a contact portion between the valve body 210 and the edge of the opening. Incidentally, various sensors such as an opening-degree sensor 320 and a vibration sensor 330 may be installed on the valve body 210.

The valve rod 230 moves the valve body 210 vertically by up/down or telescopic movement. Further, the valve rod 230 compresses the sealing material 220 by pressing the valve body 210 when closing and, when opening, draws the valve body 210 to pull apart the sealing material 220. The actuator 240 is a driving unit that generates power, which drives the valve rod 230 according to the electrical signal received from the control unit 300.

As shown in FIG. 3, the control unit 300 creates operation command by calculating with a computing unit 310 acquiring data from the opening-degree sensor 320, the vibration sensor 330, an input unit 340, etc.; the created operation command is transmitted to the actuator 240.

The computing unit 310 is a processor such as a CPU in a computer. The opening-degree sensor 320 detects the positional information of the valve body 210 between the open position and the closed position, and transmits the information to the computing unit 310 as the opening-degree of the valve body 210. The vibration sensor 330 uses the triaxial acceleration sensor or a similar device to detect the frequency and amplitude of the vibration generated only in the valve body 210 or in the vacuum valve 200, and transmits the detected frequency and amplitude to the computing unit 310. In addition, the sensor may detect the speed of the valve body 210.

The input unit 340 transmits data input from the outside to the computing unit 310. For example, the target value of the opening-degree and the target value of open/close speed, etc. are input at each time. Or instead, the data to be set in advance may be set in a storage device like a memory. For example, the upper limit (for the case vibration is large) and the lower limit (for the case vibration is small) of allowable vibration can be set as the threshold values, then, the data may be read from the storage device and transmitted to the computing unit 310.

Figure 4:
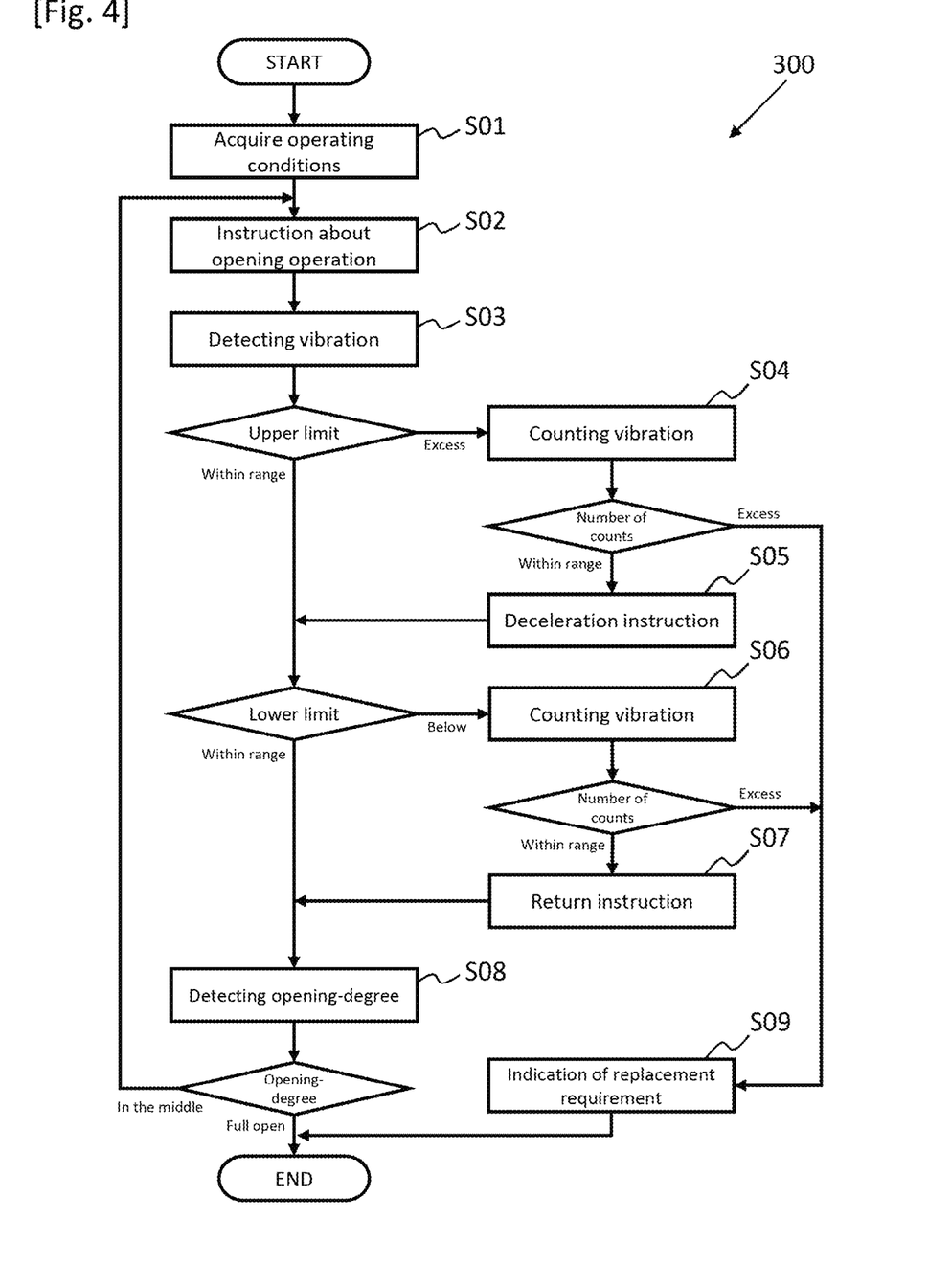
FIG. 4 is a flow chart to show the sequential flow of process of the invented control method of driving a vacuum valve.
Figure 5A:
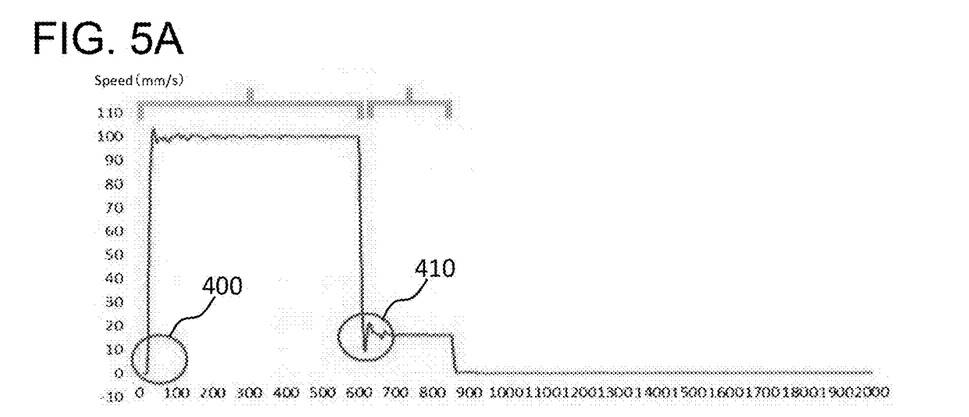
FIGS. 5A and 5B are graphs to describe conditions of execution of the invented control method of driving a vacuum valve.
Figure 5B:
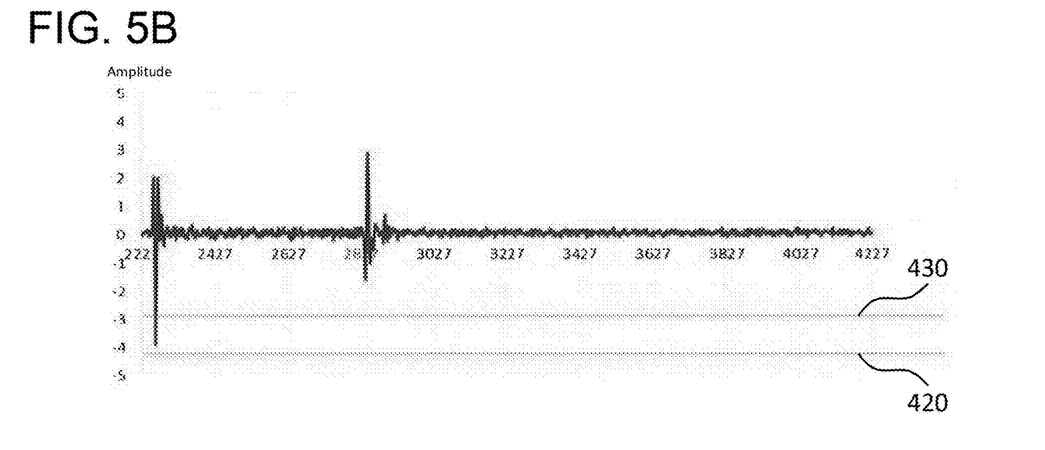

Next, the invented method for controlling the vacuum valve is described. FIG. 4 shows a flowchart of the operation sequence of the method for controlling the vacuum valve. FIG. 5 is a graph to describe conditions for executing the method for controlling the vacuum valve.

As shown in FIG. 4, in the step of acquiring the operating condition S01, the control unit 300 first acquires the operating conditions such as the target value of the opening-degree, the target value of the opening and closing speed, the timing of detecting the vibration from the input unit 340, and the vibration threshold value. As for threshold values, setting the first threshold value 1 (upper limit) and the second threshold value 2 (lower limit) in absolute values is enough. Based on the target value of the opening-degree, the control unit 300 determines whether the valve body 210 is to be opened or closed. Note that the description is based on the case that the opening is full open.

Next, at the step of the opening operation instruction S02, the control unit 300 issues an instruction to the actuator 240 so as to move the valve body 210 at that speed based on the target value of the opening/closing speed. In addition, a real time obtaining the actual speed of movement of the valve body 210 can be practicable.

Next, at the step of the vibration detection S03, the control unit 300 detects the vibration of the valve body 210 from the vibration sensor 330. It should be noted that the influence of vibrations that are not caused by driving the valve body 210 (for example, earthquakes, etc.) may be excluded by discriminating the type of vibration acquired from the vibration sensor 330.

Then, in the computing unit 310, the detected vibration is compared with the threshold value, and if the vibration exceeds both the first and the second threshold values, the number of times is added at the step of the vibration count S04, and then an instruction to slow the operation speed of the valve body 210 is issued to the actuator 240 at the step of the deceleration instruction S05.

Further, in the computing unit 310, the detected vibration is compared with the threshold value, and if the vibration is below the second threshold value, the number of times is added at the step of the vibration count S06, and then an instruction to return the operation speed of the valve body 210 is issued to the actuator 240 at the step of the returning instruction S07.

Next, in the step of opening-degree detection S08, the control unit 300 acquires the opening-degree of the valve body 210 from the opening-degree sensor 320. If the acquired opening-degree has not been reached the target value yet, the process returns to the step of the opening operation instruction S02 and the step is repeated.

Additionally, if, in the vibration count steps S04 and S06, the vibration count exceeds the predetermined count set in advance, the requirement of the parts replacement for the valve body 210 or its pertinent parts is output at the element replacing indication step S09.

FIG. 5(a) shows variation of the speed of the actuator 240 in the case of the open/close speed target value is 100 mm per second. As shown in FIG. 5(b), it is assumed that a first threshold value 420 is set to 4 mm and a second threshold value 430 is set to 3 mm.

When the amplitude at an operation start time 400 is between the first threshold value 420 and the second threshold value 430, and the operating speed of the valve body 210 is reduced to 20 mm per second, the amplitude at the time of deceleration 410 is lower than the second threshold value 430. Therefore, it is only required to return the operation speed so that the amplitude will not exceed the first threshold value 420.

According to the present invention, regulating the operation speed by detecting the vibration at the time of the vacuum valve driving slows the deterioration rate of related parts, and consequently the time of replacement will be postponed. As a result of this, the service life of the vacuum valve can be elongated. Therefore, the contamination of the substrate due to particles can be controlled by suppressing the vibration of a vacuum valve within allowable range without slowing the open/close operation time as much as possible.

Although the embodiments of the present invention have been described above, the present invention however is not limited thereto. For example, the timing for detecting the vibration of the vacuum valve includes typically following cases too. In the opening operation, such timing is when the valve body separates from the sealing material or during the valve body is in the operating movement or when the valve body stops; in the closing operation, such timing is when the valve body begins to move or during operation of the valve body or when the valve body contacts with the sealing material.

REFERENCE SIGNS LIST

100: Semiconductor manufacturing apparatus
110: Chamber
120: Vacuum pimp
200: Vacuum valve
210: Valve body
220: Sealing material
230: Valve rod
240: Actuator
300: Control unit
310: Computing unit
320: Opening-degree sensor
330: Vibration sensor
340: Input unit
400: Operation start time
410: Time of deceleration
420: First threshold value
430: Second threshold value

The invention claimed is:

1. A method of controlling a vacuum valve,
wherein the vacuum valve comprises
a valve body that opens and closes an opening of the vacuum valve,
an actuator that moves the valve body between a closed position and an open position of the valve body,
a vibration sensor for detecting vibration of the valve body, and
a computing unit that instructs the actuator about a speed of the valve body,
wherein the method of controlling the vacuum valve is characterized in that
the computing unit
stores a predefined first threshold value and a second threshold value,
instructs the actuator to reduce an operating speed so that an amplitude falls within the first threshold value when the amplitude obtained from the vibration sensor exceeds the first threshold value and the second threshold value, and instructs the actuator to return to the operating speed when the amplitude obtained from the vibration sensor is below the second threshold value.

2. The method of controlling the vacuum valve according to claim 1, wherein the computing unit counts a number of times that the amplitude acquired from the vibration sensor exceeds the first threshold and a number of times that the amplitude falls below the second threshold and then outputs a replacement requirement indication if such number exceeds a predetermined number.

3. The method of controlling the vacuum valve according to claim 1, wherein the computing unit discriminates the type of vibration acquired from the vibration sensor and excludes an influence of vibration not caused by driving the valve body.

4. The vacuum valve controlled by the method according to the method of claim 1.

\* \* \* \* \*